US 6,670,103 B2

(12) United States Patent
Chang

(10) Patent No.: US 6,670,103 B2
(45) Date of Patent: Dec. 30, 2003

(54) METHOD FOR FORMING LIGHTLY DOPED DIFFUSION REGIONS

(75) Inventor: Ching-Yu Chang, I-Lan (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 10/136,437

(22) Filed: May 2, 2002

(65) Prior Publication Data
US 2002/0177077 A1 Nov. 28, 2002

Related U.S. Application Data

(63) Continuation-in-part of application No. 09/714,195, filed on Nov. 17, 2000, now abandoned.

(51) Int. Cl.[7] ................. H01L 21/3215; H01L 21/3205; G03C 5/00
(52) U.S. Cl. ...................... 430/313; 430/312; 430/315; 438/595; 438/301; 438/303
(58) Field of Search ................. 430/312, 313, 430/315; 438/595, 307, 303

(56) References Cited

U.S. PATENT DOCUMENTS 5,567,965 A * 10/1996 Kim ........................... 257/336
6,225,229 B1 * 5/2001 Huster ........................ 438/303

* cited by examiner

Primary Examiner—Mark F. Huff
Assistant Examiner—Daborah Chacko-Davis

(57) ABSTRACT

A method for forming a lightly doped diffusion region comprises providing a substrate structure. A first photoresist layer, having a lightly doped diffusion region pattern, is formed on the substrate structure. Next, dopants of a first type conductivity are implanted into the substrate structure for forming a lightly doped diffusion region in the substrate structure. Then a second photoresist layer is conformal formed on the first photoresist layer and the substrate structure. Next, the second photoresist layer is etched back and then dopants of a second type conductivity are implanted into the substrate structure for forming a source/drain region underlying the lightly doped diffusion region in the substrate structure.

20 Claims, 3 Drawing Sheets

METHOD FOR FORMING LIGHTLY DOPED DIFFUSION REGIONS

This application is a continuation-in-part of U.S. patent application Ser. No. 09/714,195, filed Nov. 17, 2000 now abandoned.

BACKGROUND OF THE INVENTION

1. Field of the Invention

The invention relates to a method for forming lightly doped diffusion regions, and more particularly to a method for forming lightly doped diffusion regions for dense mask read-only memory devices.

2. Description of the Prior Art

Memory capacities in digital systems are usually expressed in terms of bits, since a separate storage device or circuit is used to store each bit of data. Each storage element is referred to as a cell. Memory capacities are also sometimes stated in terms of bytes or words. Each byte typically represents an alphanumeric character. Every bit, byte or word is stored in a particular location, identified by a unique numeric address, and only a single bit, byte, or word is stored or retrieved during each cycle of memory operation.

Memory-storage capability is expressed in units of kilobits and megabits (or kilobytes and megabytes). Since memory addressing is based on binary codes, capacities that are integral powers of 2 are typically used. As a result, a memory device with a 1-kbit capacity can actually store 1024 bits, and a 64-kbit device can store 65536 bits. In digital computers, the number of memory bits is usually 100 to 1000 times greater than the number of logic gates, which implies that the memory cost per bit must be kept very low. In addition, it is desirable for the memory devices to be as small as possible, to operate at a high speed, to have a small power consumption, and to operate reliably.

When the memory devices are considered for specific functions, such as high speed or reliability, the addition of lightly doped diffusion region structure is necessary. Typically, there are two methods for forming lightly doped diffusion regions in a semiconductor structure. One is formation of spacer oxide, such as spacers on a gate structure. The other is implemented by salicide process. However, those methods are sot complicated that may raise the manufacture costs of the memory devices.

SUMMARY OF THE INVENTION

Accordingly, it is an object of the present invention to provide a method for forming lightly doped diffusion regions. The lightly doped diffusion regions are formed without depending on formation of spacer oxide or salicide process.

It is another further object of the present invention to provide a method for forming lightly doped diffusion regions in mask read-only memory devices. In the present invention, a photoresist layer is formed on a former formed photoresist layer and then etched back for forming a spacer-shaped mask at the sidewalls of the former formed photoresist layer.

In one embodiment, a method for forming lightly doped diffusion regions in a semiconductor read-only memory comprises providing a silicon substrate of a first type conductivity. A first photoresist layer, having a lightly doped diffusion region pattern, is formed on the silicon substrate. Next, dopants of the first type conductivity are implanted into the silicon substrate for forming a lightly doped diffusion region in the silicon substrate. A second photoresist layer is formed on and at, the surface and sidewalls of the first photoresist layer, and on the surface of the silicon substrate. Then the second photoresist layer is etched back and dopants of a second type conductivity are implanted into the silicon structure for forming a source/drain region underlying the lightly doped diffusion region in the silicon substrate.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

The semiconductor devices of the present invention are applicable to a board range of semiconductor devices and can be fabricated from a variety of semiconductor materials. While the invention is described in terms of a single preferred embodiment, those skilled in the art will recognize that many steps described below can be altered and that species and types of the substrate and the dopant as well as other materials substitutions can be freely made without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarify of illustration and should not be interpreted in a limiting sense. Accordingly, these regions will have dimensions, including length, width and depth, when fabricated in an actual device.

The present invention provides a method for forming lightly doped diffusion regions in a mask read-only memory comprises providing a silicon substrate of a first type conductivity. A first photoresist layer, having a lightly doped diffusion region pattern, is formed on the silicon substrate. Next, dopants of the first type conductivity are implanted into the silicon substrate for forming a lightly doped diffusion region in the silicon substrate. Then a second photoresist layer is formed on and at, the surface and sidewalls of the first photoresist layer, and on the surface of the silicon substrate. The second photoresist layer is then etched back to be left as spacer-shaped at sidewalls of the first photoresist layer and at corners between the first photoresist layer and the silicon substrate. Next, dopants of a second type conductivity are implanted into the silicon substrate for forming a source/drain region underlying the lightly doped diffusion region in the silicon substrate.

Figure 1A:
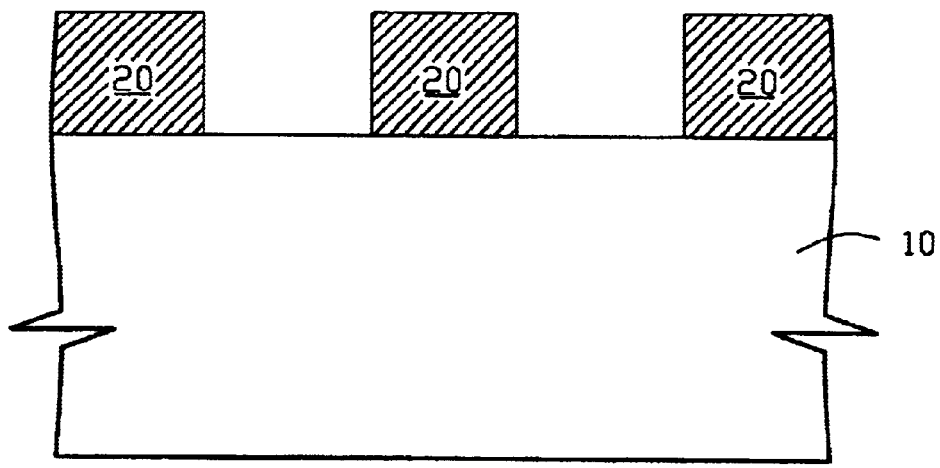
FIGS. 1A–1E are cross-sectional drawings illustrating a method for forming lightly doped diffusion regions of mask read-only memory devices in accordance with the present invention.

A preferred embodiment substantially provides a method for forming lightly doped diffusion regions in mask ROM devices. As depicted in FIG. 1A, a substrate structure 10 is provided with a first photoresist layer 20 formed thereon. In the preferred embodiment, the substrate structure 10 is a P-type silicon substrate. On the other hand, the first photoresist layer 20, having a thickness about 5000 angstroms, is first formed on the whole substrate structure 10 and thereafter a lightly doped diffusion region pattern (not shown) is transferred into the first photoresist layer 20. The first photoresist layer 20 is etched to exposure partial surface of the substrate structure 10 according to the definition of the lightly doped diffusion region pattern.

Figure 1B:
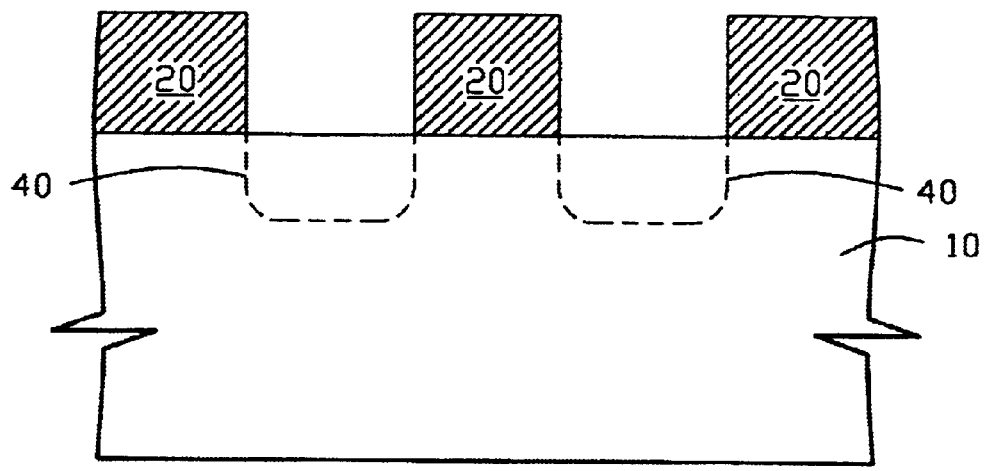

Next, a p-type dopants, such as boron, are implanted into the exposed substrate structure 10 to form some lightly doped diffusion regions in the substrate structure 10. As shown in FIG. 1B, the lightly doped diffusion regions are illustrated bounded with dash lines 40. In the preferred embodiment, the dopants for lightly doped diffusion regions are implanted with energies of about 30 keV at a dose of about 10E13 atoms/cm$^2$.

Figure 1C:
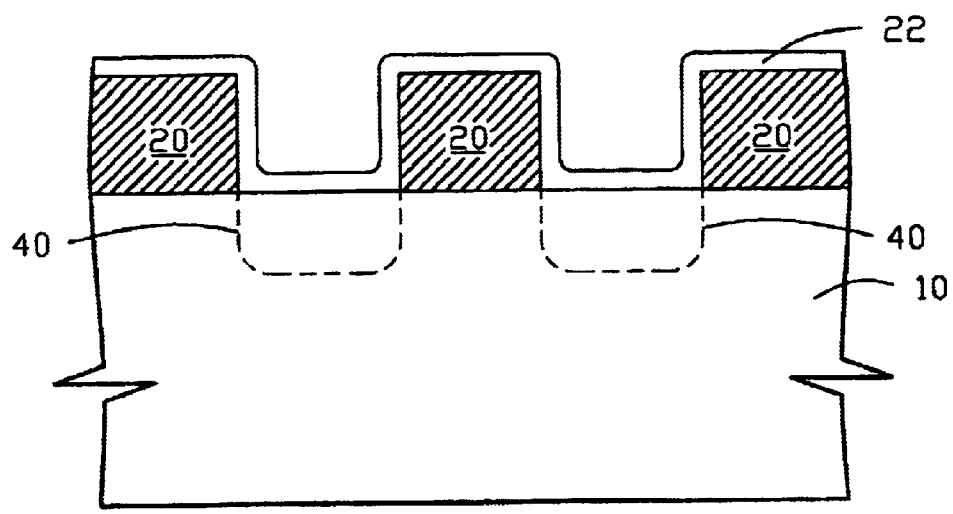

As a key step of the present invention is as shown in FIG. 1C. Instead of stripping of the first photoresist layer 10, a second photoresist layer 22 is conformal formed on the top surface of the first photoresist layer 20, the sidewalls of the first photoresist layer 20, and the surface of the exposed substrate structure 10. In the preferred embodiment, the second photoresist layer 22 has a thickness about 5000 angstroms.

Figure 1D:
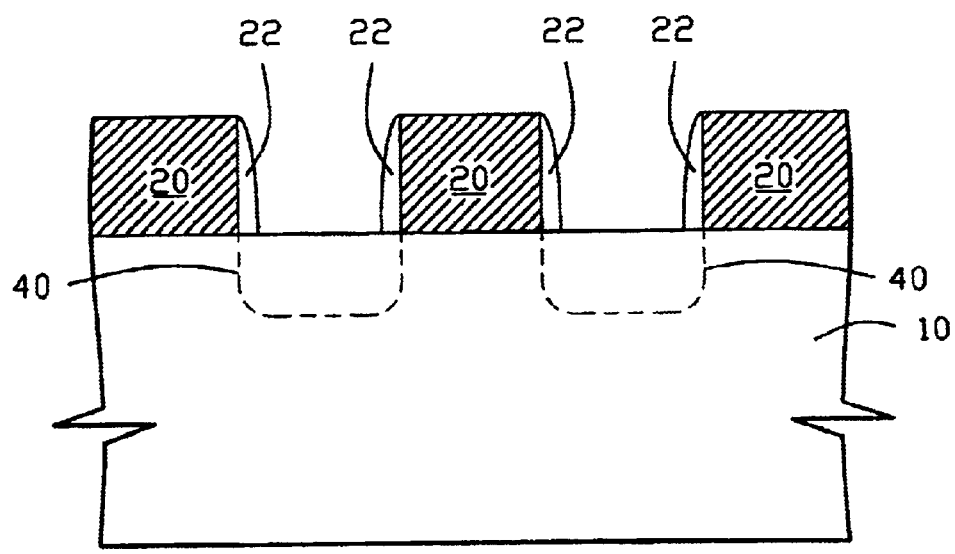

Next, the second photoresist layer 22 is etched back as shown in FIG. 1D. In particular, the second photoresist layer 22, only at the sidewalls of the first photoresist layer 20 and on partial surface of the exposed substrate structure 10, is left as spacer shape after the etching back step. Furthermore, the surface regions of the substrate structure 10, exposed by the second photoresist layer 22, is narrower than ones exposed by the first photoresist layer 20.

Figure 1E:
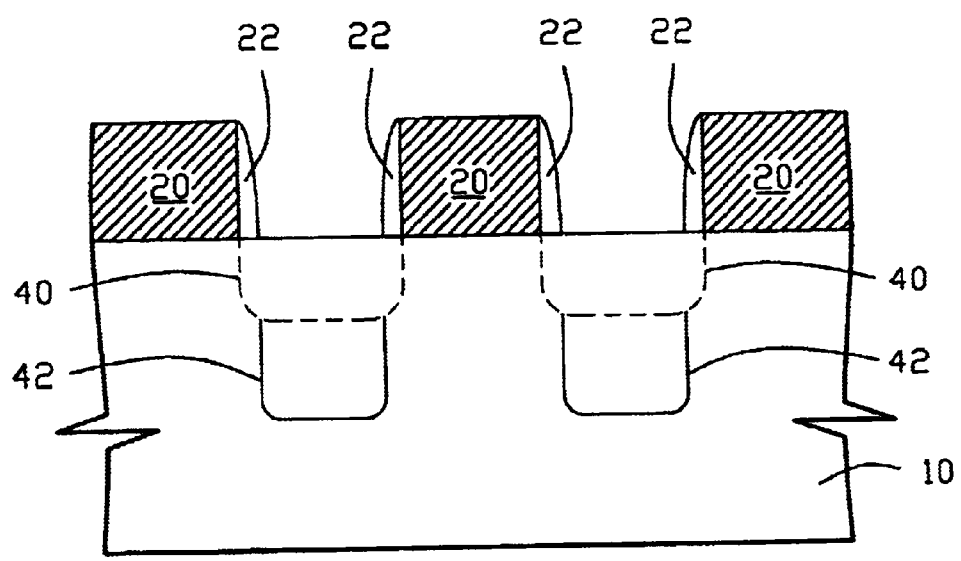

The n-type dopants (not shown), such as arsenic, are then implanted into the substrate structure 10 through the lightly doped diffusion regions. To be specific, the n-type dopants are deeper in the substrate structure 10 than the p-type dopants in the light doped drains. On the other hand, the n-type dopants are implanted with energies of about 70 keV at a dose of about 10E15 atoms/cm$^2$. Then source/drain regions, narrower than lightly doped diffusion regions, are formed in the substrate structure 10 and illustrated with bound lines 42 in FIG. 1E. The lightly doped diffusion regions of the present invention are used to insulate two conductors and to avoid leakage defects.

It is an object of the present invention to simplify the formation of the lightly doped diffusion regions. Without formation of spacer oxide or utilization of salicide process, the present invention are capable of forming the lightly doped diffusion regions of the mask ROM devices just by addition of formation of one photoresist on the other one and subsequent etching back of the former one.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming ion-implanted regions with conducting types, said method comprising:

providing a substrate structure;

forming a first photoresist layer on a part of said substrate structure;

implanting dopants of a first conducting type into said substrate structure for forming a first ion-implanted region in said substrate structure;

conformally forming a second photoresist layer on said first photoresist layer and said substrate structure;

etching a part of said second photoresist layer; and implanting dopants of a second conducting type into said substrate structure to form a second ion-implanted region underlying said first ion-implanted region in said substrate structure, wherein said first conducting type is contrary to said second conducting type.

2. The method according to claim 1, wherein said substrate structure comprises a silicon substrate.

3. The method according to claim 2, wherein said silicon substrate is p-type.

4. The method according to claim 1, wherein said first conducting type is p-type.

5. The method according to claim 4, wherein said dopants of said first conducting type comprise boron implants.

6. The method according to claim 1, wherein said second conducting type is n-type.

7. The method according to claim 6, wherein said dopants of said second conducting type comprise arsenic implants.

8. The method according to claim 1, wherein an implanting energy of said dopants of said second conducting type is higher than an implanting energy of said dopants of said first conducting type.

9. A method for forming lightly doped diffusion regions in a semiconductor read only memory, said method comprising:

providing a silicon substrate of a first conducting type;

forming a first photoresist layer on a part of said silicon substrate;

implanting dopants of said first conducting type into said silicon substrate for forming a lightly doped diffusion region in said silicon substrate;

forming a second photoresist layer on and at, the surface and sidewalls of said first photoresist layer and the surface of said silicon substrate;

etching back a part of said second photoresist layer to expose a part of the surface of said silicon substrate and the surface of said first photoresist layer; and implanting dopants of a second conducting type into a part of said silicon substrate to form an ion-implanted region underlying said lightly doped diffusion region in said silicon substrate, wherein said first conducting type is contrary to said second conducting type.

10. The method according to claim 9, wherein said first conducting type is p-type.

11. The method according to claim 9, wherein said second conducting type is n-type.

12. The method according to claim 9, wherein an implanting energy of said dopants of said second conducting type is higher than an implanting energy of said dopants of said first conducting type.

13. A method for forming lightly doped diffusion regions in a mask read only memory, said method comprising:

providing a silicon substrate of a first conducting type;

forming a first photoresist layer on a part of said silicon substrate;

implanting dopants of said first conducting type into a part of said silicon substrate to form a lightly doped diffusion region in a part of said silicon substrate;

forming a second photoresist layer on and at, the surface and sidewalls of said first photoresist layer and the surface of said silicon substrate;

etching back said second photoresist layer and thereafter said second photoresist layer left as spacer-shaped at sidewalls of said first photoresist layer and at corners between said first photoresist layer and said silicon substrate; and implanting dopants of a second conducting type into a part of said silicon substrate for forming a source and drain region underlying said lightly doped diffusion region, wherein said first conducting type is contrary to said second conducting type.

14. The method according to claim 13, wherein said first conducting type is p-type.

15. The method according to claim 13, wherein said second conducting type is n-type.

16. The method according to claim 13, wherein an implanting energy of said dopants of said second conducting type is higher than an implanting energy of said dopants of said first conducting type.

17. A method for forming lightly doped diffusion region in a mask read only memory device, said method comprising:

providing a silicon substrate of a first conducting type;

forming a first photoresist layer on a part of said silicon substrate;

implanting dopants of said first conducting type into a part of said silicon substrate to form a lightly doped diffusion region in said silicon substrate;

forming a second photoresist layer on and at, the surface and sidewall of said first photoresist layer and the surface of said silicon substrate; and implanting dopants of a second conducting type into a part of said silicon substrate to form a source and drain region underlying said lightly doped region in said silicon substrate, wherein said first conducting type is contrary to said second conducting type.

18. The method according to claim 17, wherein said first conducting type is p-type.

19. The method according to claim 17, wherein said second conducting type is n-type.

20. The method according to claim 17, wherein a width of said source and drain region is narrower than a width of said lightly doped diffusion region.

\* \* \* \* \*